US012690393B2

(12) United States Patent
Konishi et al.

(10) Patent No.: US 12,690,393 B2
(45) Date of Patent: Jul. 21, 2026

(54) FILM STRUCTURE AND METHOD FOR PRODUCING THE SAME

(71) Applicant: I-PEX Piezo Solutions Inc., Yamaguchi (JP)

(72) Inventors: Akio Konishi, Yamaguchi (JP); Hiroaki Kanamori, Yamaguchi (JP)

(73) Assignee: I-PEX PIEZO SOLUTIONS INC., Yamaguchi (JP)

( * ) Notice: Subject to any disclaimer, the term of this patent is extended or adjusted under 35 U.S.C. 154(b) by 913 days.

(21) Appl. No.: 17/990,904

(22) Filed: Nov. 21, 2022

(65) Prior Publication Data

US 2023/0172069 A1     Jun. 1, 2023

(30) Foreign Application Priority Data

Nov. 26, 2021    (JP) ................................. 2021-191779

(51) Int. Cl.
| | |
|---|---|
| *H10N 30/00* | (2023.01) |
| *C30B 23/02* | (2006.01) |
| *C30B 29/02* | (2006.01) |
| *C30B 29/32* | (2006.01) |
| *C30B 29/68* | (2006.01) |

(Continued)

(52) U.S. Cl.
CPC ......... *H10N 30/708* (2024.05); *C30B 23/025* (2013.01); *C30B 29/02* (2013.01); *C30B 29/32* (2013.01); *C30B 29/68* (2013.01); *H10N 30/076* (2023.02); *H10N 30/079* (2023.02); *H10N 30/853* (2023.02); *H10N 30/8542* (2023.02); *H10N 30/8554* (2023.02)

(58) Field of Classification Search
CPC ............. H10N 30/708; H10N 30/8542; H10N 30/076; H10N 30/8554
USPC ......................................................... 310/558
See application file for complete search history.

(56) References Cited

U.S. PATENT DOCUMENTS

| | | |
|---|---|---|
| 2010/0156241 A1 | 6/2010 | Suzuki et al. |
| 2012/0234529 A1* | 9/2012 | Seerup ............... G05D 23/1934 |
| | | 165/200 |

(Continued)

FOREIGN PATENT DOCUMENTS

| | | |
|---|---|---|
| JP | 2000-315935 | 11/2000 |
| JP | 2010-171955 | 8/2010 |

(Continued)

OTHER PUBLICATIONS

Takeshi, Nov. 29, 2018, machine translation of WO 2018216227 (Year: 2018).*

(Continued)

*Primary Examiner* — Bumsuk Won
(74) *Attorney, Agent, or Firm* — Wenderoth, Lind & Ponack, L.L.P.

(57) ABSTRACT

A film structure comprises a substrate and a buffer film formed on the substrate. The substrate is a 36° to 48° rotated Y-cut Si substrate, or the substrate is a SOI substrate comprising a base substance made of the 36° to 48° rotated Y-cut Si substrate, an insulating layer on the base substance, and a SOI layer made of a Si film on the insulating layer, and a Miller index of a crystal plane of an upper surface of the SOI layer is equal to the Miller index of a crystal plane of an upper surface of the base substance. The buffer film comprises $ZrO_2$ epitaxially grown on the substrate.

15 Claims, 18 Drawing Sheets

(51) Int. Cl.
   *H10N 30/076* (2023.01)
   *H10N 30/079* (2023.01)
   *H10N 30/853* (2023.01)

(56) References Cited

U.S. PATENT DOCUMENTS

| | | | |
|---|---|---|---|
| 2012/0273117 A1 | 11/2012 | Suzuki et al. | |
| 2017/0158571 A1 | 6/2017 | Kijima | |
| 2020/0091402 A1* | 3/2020 | Xiong | H10N 30/877 |
| 2020/0091403 A1* | 3/2020 | Xiong | H10N 30/05 |
| 2020/0381610 A1* | 12/2020 | Arimoto | H10N 30/076 |
| 2021/0234529 A1 | 7/2021 | Uno et al. | |
| 2021/0359660 A1 | 11/2021 | Tanno et al. | |
| 2025/0023543 A1 | 1/2025 | Tanno et al. | |

FOREIGN PATENT DOCUMENTS

| | | |
|---|---|---|
| JP | 2018-081974 | 5/2018 |
| JP | 2018-081975 | 5/2018 |
| JP | 2021-180465 | 11/2021 |
| WO | 2016/009698 | 1/2016 |

OTHER PUBLICATIONS

Takeshi, Sep. 10, 2020, machine translation of WO 2020179210 (Year: 2020).*
Extended European Search Report issued Mar. 20, 2023 in corresponding European Patent Application No. 22207859.4.
Office Action issued May 7, 2025 in Japanese Patent Application No. 2021-191779, with English-language Translation.
Notification of Reasons for Rejection issued Mar. 2, 2026 in corresponding Taiwanese Patent Application No. 111138656, with English language translation.

* cited by examiner

FILM STRUCTURE AND METHOD FOR PRODUCING THE SAME

BACKGROUND OF THE INVENTION

1. Technical Field

The present invention relates to a film structure and a method for producing the same.

2. Description of the Related Art

As a film structure comprising a substrate, a buffer film formed on the substrate, and a metal film formed on the buffer film, there is a known film structure comprising a silicon (Si) substrate, a buffer film containing zirconium oxide ($ZrO_2$) formed on the Si substrate, and a metal film containing platinum (Pt) formed on the buffer film. A film structure further comprising a piezoelectric film formed on a metal film is also known.

JP 2018-81974 A discloses a technique of comprising, in a film structure: a substrate including a base substance, an insulating layer on the base substance, and a silicon layer on the insulating layer; a first film containing zirconium oxide epitaxially grown on the silicon layer; a first conductive film containing platinum epitaxially grown on the first film; and a piezoelectric film epitaxially grown on the first conductive film.

JP 2018-81975 A discloses a technique of comprising, in a film structure: a silicon substrate; a first film containing zirconium formed on the silicon substrate; a second film containing zirconium oxide epitaxially grown on the first film; a first conductive film containing platinum epitaxially grown on the second film; and a piezoelectric film epitaxially grown on the first conductive film.

SUMMARY OF THE INVENTION

In the techniques described in JP 2018-81974 A and JP 2018-81975 A, a film structure comprises a buffer film containing $ZrO_2$ formed on a silicon layer or a silicon substrate, and a metal film containing Pt formed on the buffer film. However, it becomes difficult to make the metal films formed on the buffer film align in a fixed direction depending on the type of the silicon layer or the silicon substrate or the type of the buffer film. In such a case, when a piezoelectric film is further formed on the metal film, it also becomes hard to make the piezoelectric films formed on the metal film align in a fixed direction.

The present invention has been made to solve the above-mentioned problems of the prior art, and an object of the present invention is to provide a film structure having a buffer film formed on a substrate, in which it is possible to make metal films or piezoelectric films formed on the buffer film align in a fixed direction.

An overview of representative aspects, of the invention disclosed in the present application, will be briefly described as follows.

A film structure according to one aspect of the present invention comprises a substrate and a buffer film formed on the substrate. The substrate is a 36° to 48° rotated Y-cut Si substrate, or the substrate is a SOI substrate including a base substance made of the 36° to 48° rotated Y-cut Si substrate, an insulating layer on the base substance, and a SOI layer made of a Si film on the insulating layer, and a Miller index of a crystal plane of an upper surface of the SOI layer is equal to a Miller index of a crystal plane of an upper surface of the base substance. The buffer film includes $ZrO_2$ epitaxially grown on the substrate.

As another aspect, the film structure may comprise a metal film epitaxially grown on the buffer film.

As another aspect, the metal film may contain Pt.

As another aspect, the film structure may comprise a SRO film epitaxially grown on the metal film.

As another aspect, the film structure may comprise a piezoelectric film epitaxially grown on the metal film.

As another aspect, the film structure may comprise a piezoelectric film epitaxially grown on the SRO film.

As another aspect, two diffraction peaks respectively representing SRO (110) planes of the SRO film may be observed in an in-plane X-ray diffraction pattern of the film structure.

As another aspect, the film structure may comprise a piezoelectric film epitaxially grown on the buffer film.

As another aspect, the piezoelectric film may contain PZT, AlN, $LiTaO_3$ or $LiNbO_3$.

As another aspect, the piezoelectric film may be a PZT film containing PZT, and two diffraction peaks respectively representing PZT (213) planes of the PZT film may be observed in an in-plane X-ray diffraction pattern of the film structure.

As another aspect, in an X-ray reciprocal lattice space mapping of the film structure, three reciprocal lattice points respectively representing a PZT (110) plane of the PZT film, a Si (220) plane of the substrate, and a PZT (112) plane of the PZT film may be aligned in a Qz direction.

A method for producing a film structure according to one embodiment of the present invention comprising: an (a) step for preparing a substrate; and a (b) step for forming a buffer film on the substrate. During the (a) step, a 36° to 48° rotated Y-cut substrate is prepared, or a SOI substrate including a base substance made of the 36° to 48° rotated Y-cut Si substrate, an insulating layer on the base substance, and a SOI layer made of a Si film on the insulating layer, is prepared, and a Miller index of a crystal plane of an upper surface of the SOI layer is equal to a Miller index of a crystal plane of an upper surface of the base substance. During the (b) step, the buffer film including $ZrO_2$ epitaxially grown on the substrate is formed.

As another aspect, the method for producing the film structure may comprise a (c) step for forming a metal film epitaxially grown on the buffer film, wherein the metal film may contain Pt.

As another aspect, the method for producing the film structure may comprise a (d) step for forming a SRO film epitaxially grown on the metal film, wherein two diffraction peaks respectively representing SRO (110) planes of the SRO film may be observed in an in-plane X-ray diffraction pattern of the film structure.

As another aspect, the method for producing the film structure may comprise an (e) step for forming a piezoelectric film epitaxially grown on the metal film, wherein piezoelectric film may contain PZT, AlN, $LiTaO_3$, or $LiNbO_3$.

By employing one aspect of the present invention in a film structure having a buffer film formed on a substrate, it is possible to make metal films or piezoelectric films formed on the buffer film align in a fixed direction.

DETAILED DESCRIPTION

Figure 1:
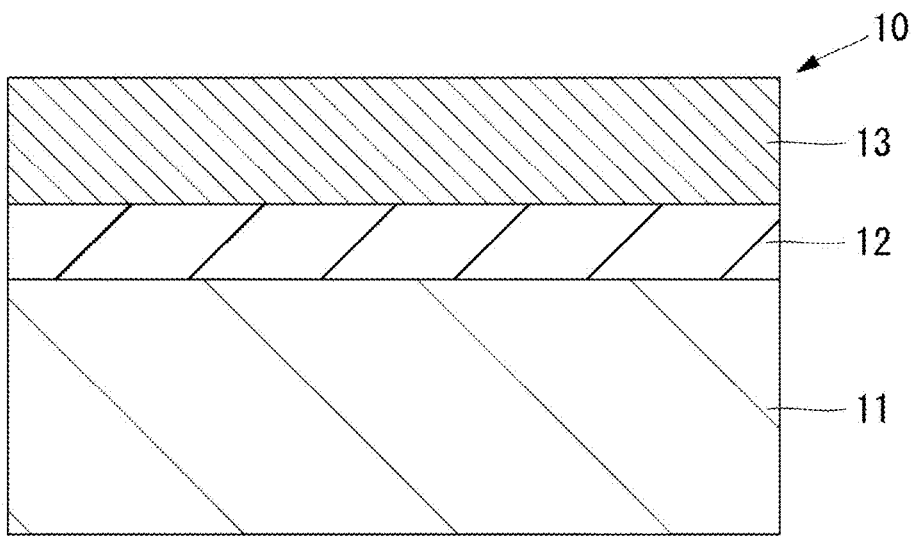
FIG. 1 is a cross-sectional view of a film structure according to an embodiment.

Hereinafter, embodiments of the present invention will be described with reference to the drawings.

Note that the disclosure is merely an example, and appropriate modifications that could be easily conceived of by a person skilled in the art while maintaining the gist of the invention are naturally included in the scope of the present invention. In addition, in order to make the explanation clearer, the drawings may schematically represent the width, thickness, shape, and the like of each component as compared with the embodiments. However, the drawings are merely examples and do not limit the interpretation of the present invention.

Furthermore, in the present specification and the respective drawings, components similar to those already illustrated in the previous drawings are denoted by the same reference numerals, and detailed description thereof may be appropriately omitted.

Furthermore, in the drawings used in the embodiments, hatching (shading) added to distinguish the structure may be omitted depending on the drawings.

In the following embodiments, when a range is indicated as A to B, the range indicates a range between A or more and B or less unless otherwise specified.

EMBODIMENTS

\<Film Structure\>

Figure 2:
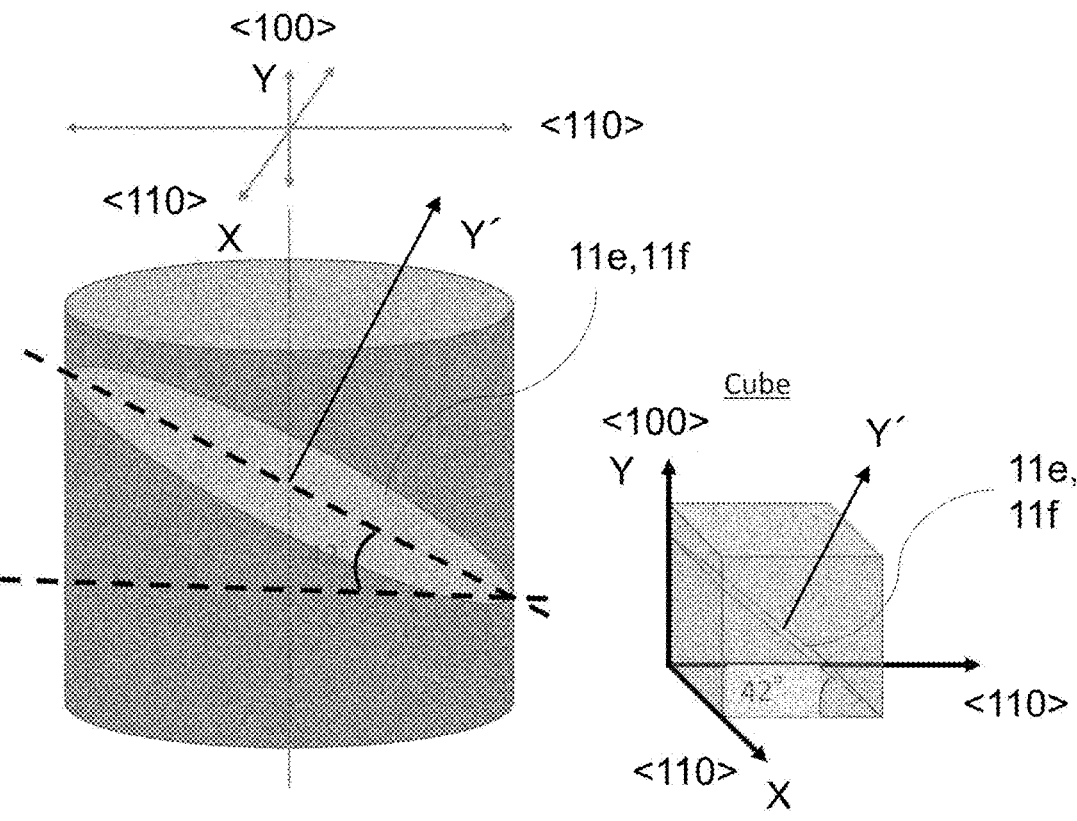
FIG. 2 illustrates a 42° rotated Y-cut Si substrate.
Figure 3:
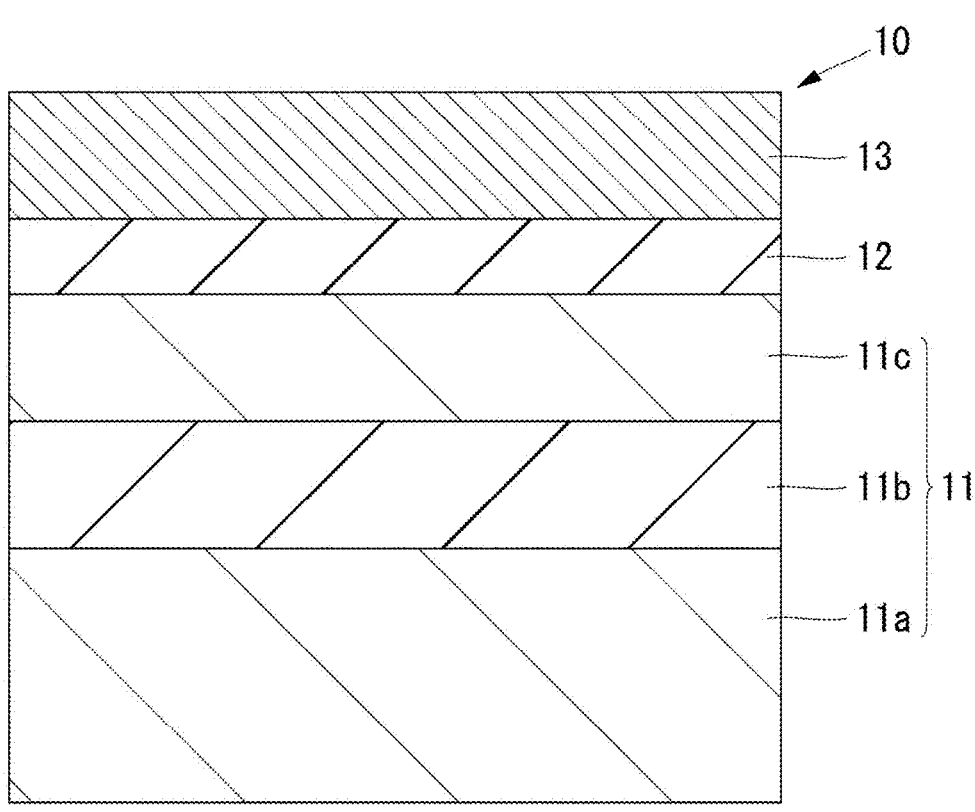
FIG. 3 is a cross-sectional view of a film structure according to the embodiment.
Figure 4:
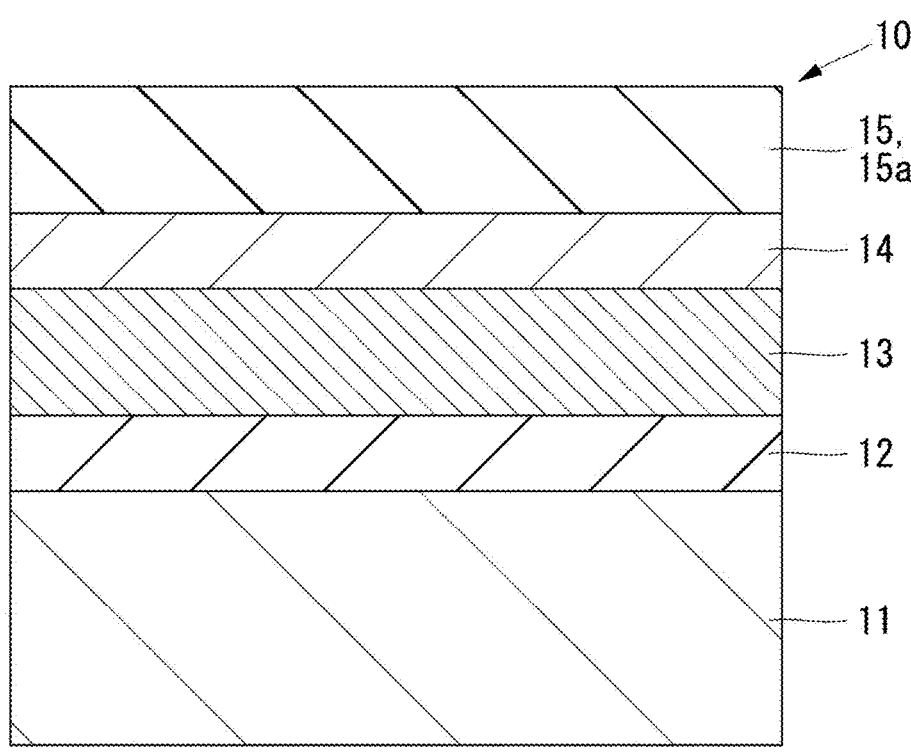
FIG. 4 is a cross-sectional view of a film structure according to the embodiment.

First, a film structure according to the embodiment of the present invention will be described. FIG. 1 is a cross-sectional view of a film structure according to the embodiment. FIG. 2 illustrates a 42° rotated Y-cut Si substrate. FIGS. 3 and 4 are cross-sectional views of a film structure according to the embodiment.

As illustrated in FIG. 1, a film structure 10 according to the present embodiment comprises a substrate 11 that is a Si substrate, a buffer film 12 containing $ZrO_2$ epitaxially grown on the substrate, and a metal film 13 epitaxially grown on the buffer film 12. Si represents silicon and $ZrO_2$ represents zirconium oxide.

In the techniques described in JP 2018-81974 A and JP 2018-81975 A, a film structure comprises a buffer film containing $ZrO_2$ formed on a silicon layer or a silicon substrate, and a metal film containing Pt formed on the buffer film. However, it becomes difficult to make the metal films formed on the buffer film align in a fixed direction depending on the type of the silicon layer or the silicon substrate or the type of the buffer film. In such a case, when a piezoelectric film is further formed on the metal film, it also becomes hard to make the piezoelectric films formed on the metal film align in a fixed direction.

On the other hand, the substrate 11 included in the film structure 10 of the present embodiment is a 36° to 48° rotated Y-cut Si substrate.

As illustrated in FIG. 2, when an axis extending along a Si \<110\> direction is set as an X axis and an axis extending along a Si \<100\> direction is set as a Y axis, for example, a 42° rotated Y-cut Si substrate is a Si substrate 11$f$ having an upper surface 11$e$ perpendicular to the Y' axis that is an axis obtained by rotating the Y axis by 42° around the X axis extending along the Si \<110\> direction.

When the substrate 11 is a 42° rotated Y-cut Si substrate, that is, when the rotation angle of the rotated Y-cut Si substrate that is the substrate 11 is 42°, as described later with reference to FIGS. 14 to 18, the buffer film 12 includes $ZrO_2$ epitaxially grown on the substrate 11, and the metal film 13 includes a Pt film epitaxially grown on the buffer film 12. Accordingly, it becomes easier to make the metal films 13 formed on the buffer film 12 align in a fixed direction, and make piezoelectric films 15 formed on the metal film 13 align in a fixed direction, and it is possible to achieve a film structure having the polarization directions of the piezoelectric films 15 aligned in a fixed direction.

Besides, when the rotation angle of the rotated Y-cut Si substrate that is the substrate 11 is 36° or more, the rotation angle is not too far from 42° as compared to a case where the rotation angle is less than 36°. Thus, similarly to the case where the substrate 11 is a 42° rotated Y-cut Si substrate, the buffer film 12 may include $ZrO_2$ epitaxially grown on the substrate 11, and the metal film 13 may include a Pt film epitaxially grown on the buffer film 12.

Besides, when the rotation angle of the rotated Y-cut Si substrate that is the substrate 11 is 48° or less, the rotation angle is not too far from 42° as compared to a case where the rotation angle exceeds 48°. Thus, similarly to the case where the substrate 11 is a 42° rotated Y-cut Si substrate, the buffer film 12 may include $ZrO_2$ epitaxially grown on the substrate 11, and the metal film 13 may include a Pt film epitaxially grown on the buffer film 12.

Here, an epitaxially-grown film means that the film is aligned in any of three directions orthogonal to each other, that is, three-dimensionally aligned.

As illustrated in FIG. 3, a silicon-on-insulator (SOI) substrate that is a semiconductor substrate can be used, instead of the Si substrate, as the substrate 11 included in the film structure 10 of the present embodiment. That is, the substrate 11 included in the film structure 10 of the present embodiment is a Si substrate or a SOI substrate.

When a SOI substrate is used as the substrate 11, the substrate 11 includes a base substance 11a made of Si, a buried oxide (BOX) layer 11b serving as an insulating layer which is a buried oxide film formed on the base substance 11a, and a Si layer 11c which is a silicon on insulator (SOI) layer formed on the BOX layer 11b. As a result, it is possible to easily form an electronic device formed by a micro electro mechanical system (MEMS) having a plurality of piezoelectric elements formed, with high shape accuracy, on the SOI substrate.

In addition, when a SOI substrate is used as the substrate 11, the substrate 11 includes the base substance 11a made of a 36° to 48° rotated Y-cut Si substrate, the BOX layer 11b serving as an insulating layer formed on the base substance 11a, and the Si layer 11c which is a SOI layer formed on the BOX layer 11b. The Miller index (alignment direction) of a crystal plane on the upper surface of the Si layer 11c, that is, the main surface of the substrate 11 is identical to the Miller index (alignment direction) of a crystal plane on the upper surface of the base substance 11a, that is, the main surface of the base substance 11a.

When the base substance 11a is a 42° rotated Y-cut Si substrate and the Miller index (alignment direction) of a crystal plane on the upper surface of the Si layer 11c, that is, the main surface of the substrate 11 is identical to the Miller index (alignment direction) of a crystal plane on the upper surface of the base substance 11a, that is, the main surface of the base substance 11a, the buffer film 12 includes $ZrO_2$ epitaxially grown on the Si layer 11c, and the metal film 13 includes a Pt film epitaxially grown on the buffer film 12, similarly to the case where the substrate 11 is a 42° rotated Y-cut Si substrate. Accordingly, it becomes easier to make the metal films 13 formed on the buffer film 12 align in a fixed direction, and make piezoelectric films 15 formed on the metal film 13 align in a fixed direction, and it is possible to achieve a film structure having the polarization directions of the piezoelectric films 15 aligned in a fixed direction.

Besides, when the rotation angle of the rotated Y-cut Si substrate that is the base substance 11a is 36° or more, the rotation angle is not too far from 42° as compared to a case where the rotation angle is less than 36°. Thus, similarly to the case where the base substance 11a is a 42° rotated Y-cut Si substrate, the buffer film 12 may include $ZrO_2$ epitaxially grown on the Si layer 11c, and the metal film 13 may include a Pt film epitaxially grown on the buffer film 12.

Besides, when the rotation angle of the rotated Y-cut Si substrate that is the base substance 11a is 48° or less, the rotation angle is not too far from 42° as compared to a case where the rotation angle exceeds 48°. Thus, similarly to the case where the base substance 11a is a 42° rotated Y-cut Si substrate, the buffer film 12 may include $ZrO_2$ epitaxially grown on the Si layer 11c, and the metal film 13 may include a Pt film epitaxially grown on the buffer film 12.

Preferably, the metal film 13 includes a Pt film. Pt represents platinum.

Since the buffer film 12 contains $ZrO_2$ epitaxially grown on the substrate 11, it becomes possible to make the Pt film included in the metal film 13 align in a fixed direction.

Since the metal film 13 includes the Pt film, the Pt films are aligned in the fixed direction, and thus, it becomes more easier to make the piezoelectric films 15 formed on the metal film 13 align in a fixed direction.

Preferably, the piezoelectric film 15 contains PZT, AlN, LiTaO₃ or LiNbO₃. PZT is also denoted as $Pb(Zr_{1-x}Ti_x)O_3$ and represents lead zirconate titanate. AlN represents aluminum nitride, LiTaO₃ represents lithium tantalate, and LiNbO₃ represents lithium niobate.

Since the piezoelectric film 15 contains PZT, AlN, LiTaO₃ or LiNbO₃, and since the piezoelectric constants of PZT, AlN, LiTaO₃ or LiNbO₃ are larger than those of the other materials, the piezoelectric property of the piezoelectric film 15 can be improved.

When the metal film 13 includes an epitaxially-grown Pt film, as illustrated in FIG. 4, the film structure 10 preferably includes a SrRuO₃ (SRO) film, that is, a SRO film 14 epitaxially grown on the metal film 13. SrRuO₃ (SRO) represents strontium ruthenate.

SRO has a perovskite-type structure. Therefore, when the film structure 10 has the SRO film 14 epitaxially grown on the metal film 13, the piezoelectric film 15 containing the complex oxide having the perovskite-type structure can be more easily epitaxially grown on the substrate 11 as compared with a case where the film structure 10 has no SRO film epitaxially grown on the metal film 13. In such a case, the film structure 10 includes the piezoelectric film 15 epitaxially grown on the SRO film 14.

When the film structure 10 has the SRO film 14 epitaxially grown on the metal film 13, two diffraction peaks respectively representing the SRO (110) planes of the SRO film 14 are observed in the in-plane X-ray diffraction pattern of the film structure, as described later with reference to FIG. 15.

As a result, since it is obvious that the SRO film 14 has been epitaxially grown, it is possible to easily confirm that the SRO film 14 is epitaxially grown on the 36° to 48° rotated Y-cut Si substrate. Furthermore, it is estimated that the SRO film 14 has 2-fold symmetry.

When the film structure 10 has the SRO film 14 epitaxially grown on the metal film 13, as illustrated in FIG. 4, the film structure 10 preferably has a $Pb(Zr_{1-x}Ti_x)O_3$ (PZT) film that is the piezoelectric film 15 epitaxially grown on the SRO film 14, that is, a PZT film 15a containing PZT. PZT represents lead zirconate titanate. As a result, the piezoelectric property of the piezoelectric film 15 can be improved.

In such a case, two diffraction peaks respectively representing the PZT (213) planes of the PZT film 15a are observed in the in-plane X-ray diffraction pattern of the film structure, as described later with reference to FIG. 17.

As a result, since it is obvious that the PZT film 15a has been epitaxially grown, it is possible to easily confirm that the PZT film 15a is epitaxially grown on the 36° to 48° rotated Y-cut Si substrate. Furthermore, it is estimated that the PZT film 15a has 2-fold symmetry.

Preferably, as described later with reference to FIG. 18, three reciprocal lattice points respectively representing the PZT (110) plane of the PZT film 15a, the Si (220) plane of the substrate 11, and the PZT (112) plane of the PZT film 15a are aligned in a Qz direction in the X-ray reciprocal lattice space mapping of the film structure.

In such a case, it is possible to confirm that the PZT film 15a has been epitaxially grown, and it is possible to easily confirm that the PZT film 15a is epitaxially grown on the 36° to 48° rotated Y-cut Si substrate. Furthermore, it is estimated that the PZT (110) plane of the PZT film 15a perpendicular to the Si (100) plane (referred to as Si (001) plane) forming an angle of 42° with respect to the surface of the 42° rotated Y-cut Si substrate and the Si (110) plane perpendicular to the Si (001) plane are parallel to each other.

When the buffer film 12 includes $ZrO_2$ epitaxially grown on the substrate 11, it is possible to directly epitaxially grow the SRO film 14 on the buffer film 12 in a state where no metal film 13 is formed on the buffer film 12, and further epitaxially grow the piezoelectric film 15 on the SRO film 14. In such a case, the film structure 10 includes the SRO film 14 epitaxially grown directly on the buffer film 12, and includes the piezoelectric film 15 epitaxially grown on the SRO film 14.

<First Modification of Film Structure>

Figure 5:
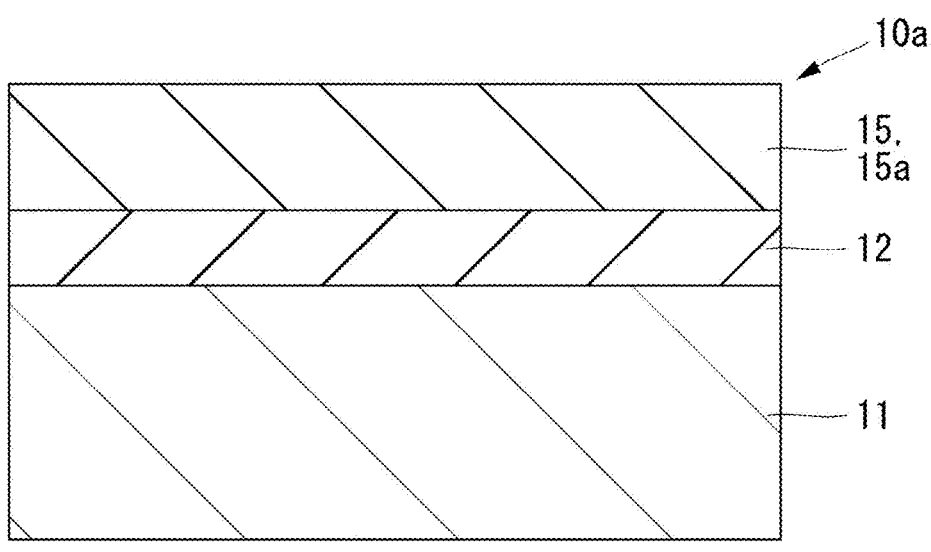
FIG. 5 is a cross-sectional view of a film structure according to a first modification of the embodiment.

Next, a first modification of the film structure of the present embodiment will be described. A film structure 10a of the first modification is different from the film structure 10 of the embodiment in that the PZT film 15a is formed as the piezoelectric film 15 on the buffer film 12 without the metal film 13 interposed therebetween. FIG. 5 is a cross-sectional view of a film structure according to the first modification of the embodiment.

As illustrated in FIG. 5, a film structure 10a according to the first modification comprises a substrate 11 that is a Si substrate, a buffer film 12 containing $ZrO_2$ epitaxially grown on the substrate, and a PZT film 15a epitaxially grown on the buffer film 12 that is the piezoelectric film 15. The substrate 11 is a 36° to 48° rotated Y-cut Si substrate, or the substrate 11 is a SOI substrate including a base substance 11a (see FIG. 3) made of the 36° to 48° rotated Y-cut Si substrate, a BOX layer 11b (see FIG. 3) on the base substance 11a, and a Si layer 11c (see FIG. 3) which is a SOI layer made of a Si film on the BOX layer 11b, and the Miller index of a crystal plane on the upper surface of the Si layer 11c is identical to the Miller index of a crystal plane of an upper surface of the base substance 11a.

In the first modification, similarly to the embodiment, the substrate 11 is a 36° to 48° rotated Y-cut Si substrate, or the Miller index (alignment direction) of a crystal plane on the upper surface of the Si layer 11c (see FIG. 3), that is, the main surface of the substrate 11 is identical to the Miller index (alignment direction) of a crystal plane on the upper surface of the base substance 11a (see FIG. 3) made of a 36° to 48° rotated Y-cut Si substrate, that is, the main surface of the base substance 11a. Accordingly, it becomes easier to make the piezoelectric films 15 formed on the buffer film 12 align in a fixed direction, and it becomes possible to achieve a film structure having the polarization directions of the piezoelectric films 15 being aligned in a fixed direction. Further, by forming a pair of comb-shaped electrodes on the upper surface of the piezoelectric film 15, it becomes possible to obtain a surface acoustic wave (SAW) device having an excellent piezoelectric property, for example. Although the metal film 13 is formed on the buffer film 12, the piezoelectric film 15 can be formed on the metal film 13 without the SRO film interposed therebetween.

<Second Modification of Film Structure>

Figure 6:
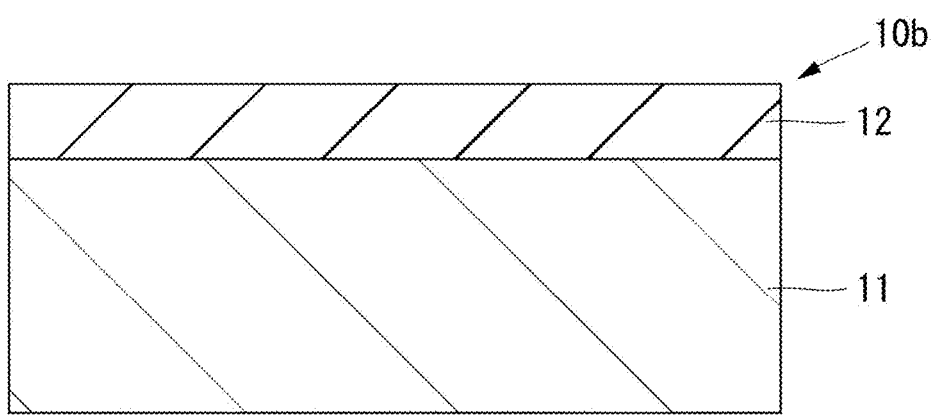
FIG. 6 is a cross-sectional view of a film structure according to a second modification of the embodiment.

Next, a second modification of the film structure of the present embodiment will be described. FIG. 6 is a cross-sectional view of a film structure according to a second modification of the embodiment.

As illustrated in FIG. 6, a film structure 10b according to the second modification comprises a substrate 11 that is a Si substrate, and a buffer film 12 containing $ZrO_2$ epitaxially grown on the substrate. Besides, the substrate 11 is a 36° to 48° rotated Y-cut Si substrate. The substrate 11 is a 36° to 48° rotated Y-cut Si substrate, or the substrate 11 is a SOI substrate including a base substance 11a (see FIG. 3) made of the 36° to 48° rotated Y-cut Si substrate, a BOX layer 11b (see FIG. 3) on the base substance 11a, and a Si layer 11c (see FIG. 3) which is a SOI layer made of a Si film on the BOX layer 11b, and the Miller index of a crystal plane on the upper surface of the Si layer 11c is identical to the Miller index of a crystal plane of an upper surface of the base substance 11a.

In the second modification, similarly to the embodiment, the substrate 11 is a 36° to 48° rotated Y-cut Si substrate, or the Miller index (alignment direction) of a crystal plane on the upper surface of the Si layer 11c, that is, the main surface of the substrate 11 is identical to the Miller index (alignment direction) of a crystal plane on the upper surface of the base substance 11a made of a 36° to 48° rotated Y-cut Si substrate, that is, the main surface of the base substance 11a. Accordingly, it becomes easier to make the metal films 13 (see FIG. 1) formed on the buffer film 12 align in a fixed direction, and make the piezoelectric films 15 (see FIG. 4) formed on the metal film 13 align in a fixed direction, and it is possible to achieve a film structure having the polarization directions of the piezoelectric films 15 aligned in a fixed direction.

<Film Forming Apparatus>

Next, a film forming apparatus as a film structure producing apparatus according to the embodiment will be described. The film forming apparatus executes a method for producing a film structure of the embodiment described below with reference to FIGS. 1, 4, 6, and 11 to 13.

Figure 7:
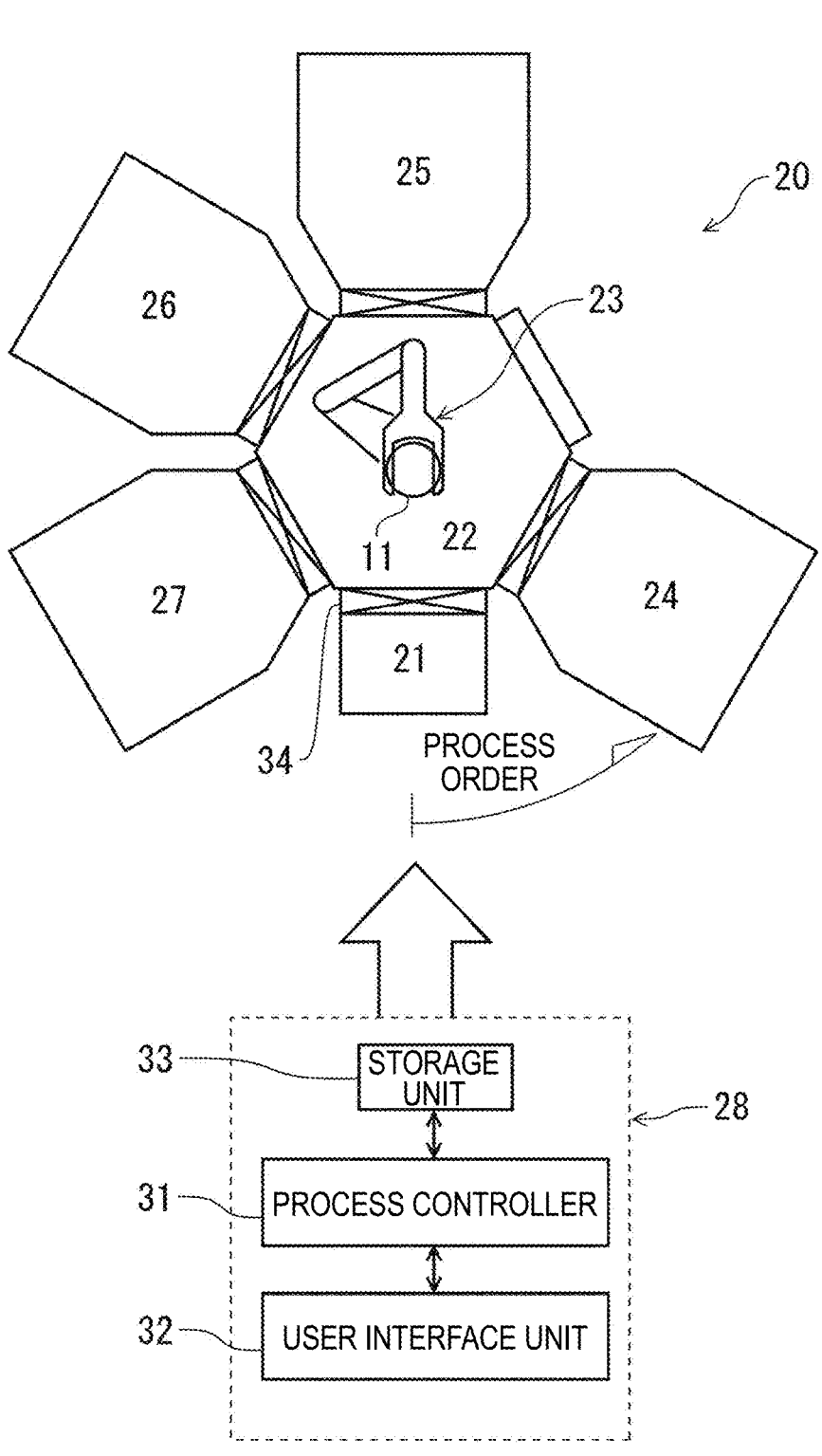
FIG. 7 is a plan view schematically illustrating a film forming apparatus according to the embodiment.
Figure 8:
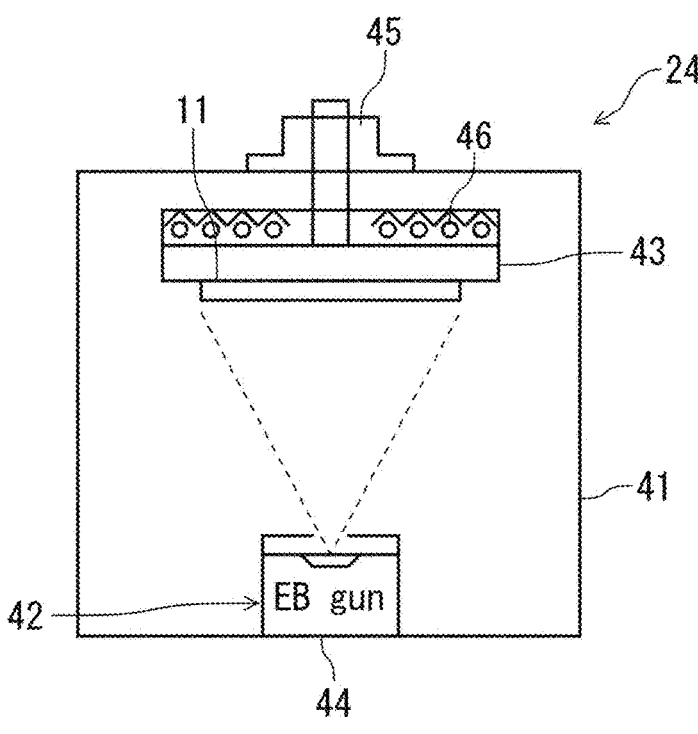
FIG. 8 is a cross-sectional view schematically illustrating an electron-beam vapor deposition device provided in the film forming apparatus according to the embodiment.
Figure 9:
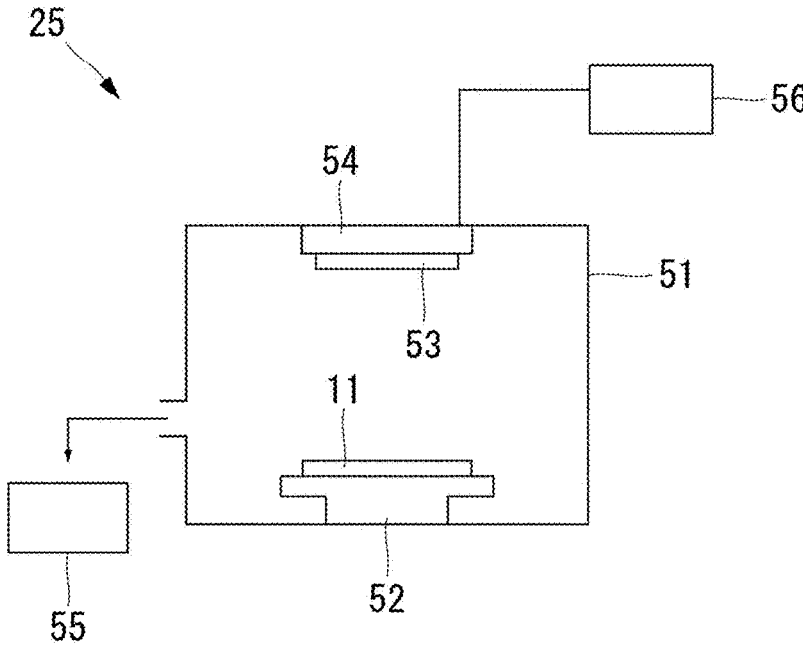
FIG. 9 is a cross-sectional view schematically illustrating a DC sputtering device provided in the film forming apparatus according to the embodiment.
Figure 10:
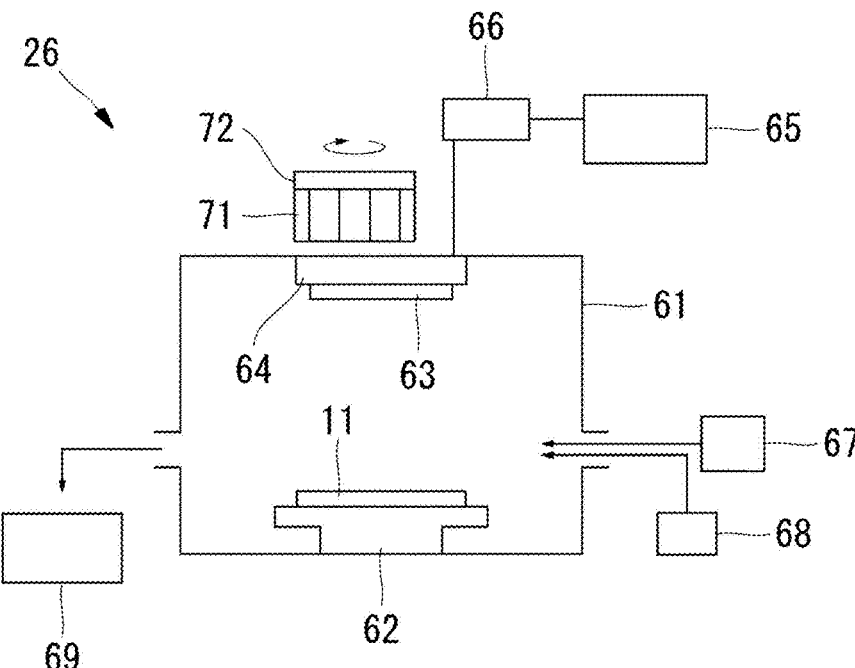
FIG. 10 is a cross-sectional view schematically illustrating a RF sputtering device provided in the film forming apparatus according to the embodiment.

FIG. 7 is a plan view schematically illustrating a film forming apparatus according to the embodiment. FIG. 8 is a cross-sectional view schematically illustrating an electron-beam vapor deposition device provided in the film forming apparatus according to the embodiment. FIG. 9 is a cross-sectional view schematically illustrating a DC sputtering device provided in the film forming apparatus according to the embodiment. FIG. 10 is a cross-sectional view schematically illustrating a RF sputtering device provided in the film forming apparatus according to the embodiment.

As illustrated in FIG. 7, the film forming apparatus 20 of the present embodiment includes a load lock chamber 21, a transfer chamber 22, a transfer robot 23, a vapor deposition chamber 24 which is an electron-beam vapor deposition device, a sputtering chamber 25 which is a DC sputtering device, a sputtering chamber 26 which is a RF sputtering device, a sputtering chamber 27 which is a RF sputtering device, and a control unit 28. Note that FIG. 7 illustrates a film forming apparatus as a multi-chamber apparatus in which the vapor deposition chamber 24 and each sputtering chamber are connected to each other via the transfer chamber 22, but the vapor deposition chamber 24 and the respective sputtering chambers may be provided independently.

The vapor deposition chamber 24, which is an electron-beam vapor deposition device, is a buffer film forming unit that forms a buffer film 12 (see FIG. 1) on the substrate 11. The sputtering chamber 25, which is a DC sputtering device, is a metal film forming unit that forms a metal film 13 (see FIG. 1) on the buffer film 12. The sputtering chamber 26, which is a RF sputtering device, is a SRO film forming unit that forms a SRO film 14 (see FIG. 4) on the metal film 13. The sputtering chamber 27, which is a RF sputtering device, is a piezoelectric film forming unit that forms a PZT film 15a (see FIG. 4) that is a piezoelectric film 15 on the SRO film 14. The control unit 28 controls operations of the load lock chamber 21, the transfer chamber 22, the transfer robot 23, the vapor deposition chamber 24, the sputtering chamber 25, the sputtering chamber 26, and the sputtering chamber 27. The control unit 28 is provided with a central processing unit (CPU), and further comprises a process controller (computer) 31 which controls respective units of the film forming apparatus 20, a user interface unit 32, and a storage unit 33.

A vacuum pump (not illustrated) is connected to the load lock chamber 21, a substrate (for example, Si wafer) to which film forming processing has been performed, is introduced into the load lock chamber 21, and the inside of the load lock chamber 21 is evacuated by the vacuum pump.

The transfer chamber 22 is connected to the load lock chamber 21 via a gate valve 34. A transfer robot 23 is disposed in the transfer chamber 22. A vacuum pump (not illustrated) is connected to the transfer chamber 22, and the inside of the transfer chamber 22 is evacuated by the vacuum pump.

As illustrated in FIG. 8, the vapor deposition chamber 24 which is an electron-beam vapor deposition device includes a film forming chamber 41, and a vapor deposition source 42 is disposed below the film forming chamber 41. A substrate holder 43 that holds the substrate 11 is disposed above the film forming chamber 41. The substrate holder 43 is disposed so as to face the vapor deposition source 42. The vapor deposition source 42 includes a crucible containing a vapor deposition material containing zirconium (Zr) and an electron gun (EB gun) 44. A cooling mechanism (not illustrated) is attached to the crucible. The vapor deposition source 42 irradiates the vapor deposition material with an electron beam emitted from the electron gun 44 to apply heat thereto, thereby evaporating the vapor deposition material.

The substrate holder 43 holds the substrate 11. The substrate holder 43 is attached to a rotation mechanism 45, and the substrate holder 43 is rotatable by the rotation mechanism 45. In addition, a heater (infrared lamp) 46 as a substrate heating mechanism is disposed in an upper portion of the substrate holder 43 (a portion opposite to a lower portion where the substrate 11 is held). A reflecting plate (not illustrated) is disposed on a lower surface (a substrate installation surface) of the substrate holder 43. Further, the substrate holder 43 includes a substrate cooling mechanism (not illustrated) for lowering the substrate temperature.

A reactant gas supply mechanism (not illustrated) for supplying a reactant gas is connected to the film forming chamber 41. The reactant gas is, for example, oxygen gas ($O_2$). An exhaust pump system (not illustrated) for lowering the internal pressure of the film forming chamber 41 to a predetermined pressure is connected to the film forming chamber 41.

Note that the film forming apparatus 20 of the present embodiment may include, as a buffer film forming unit, a boat type vapor deposition device, a reactive sputtering device, or a RF type ion plating device instead of the electron-beam vapor deposition device.

As illustrated in FIG. 9, a sputtering chamber 25 which is a DC sputtering device includes a chamber 51 and a substrate holding unit 52 which is provided in the chamber 51 and holds the substrate 11. The chamber 51, the substrate 11, and the substrate holding unit 52 are grounded. The substrate holding unit 52 preferably includes a heater (not illustrated) as a substrate heating mechanism for heating the substrate 11.

The sputtering chamber 25 includes a target holding unit 54 which is provided in the chamber 51 and holds a target 53 as a sputtering target. The target holding unit 54 is disposed such that the target 53 held by the target holding unit 54 faces the substrate 11 held by the substrate holding unit 52. The sputtering chamber 25 includes an evacuation mechanism 55 such as a vacuum pump that evacuates the inside of the chamber 51, and a power supply mechanism 56 that is electrically connected to the target holding unit 54 and supplies DC power to the target 53.

As illustrated in FIG. 10, a sputtering chamber 26 which is a RF sputtering device includes a chamber 61 and a substrate holding unit 62 which is provided in the chamber 61 and holds the substrate 11. The chamber 61, the substrate 11, and the substrate holding unit 62 are grounded. The substrate holding unit 62 preferably includes a heater (not illustrated) for heating the substrate 11.

The sputtering chamber 26 includes a target holding unit 64 which is provided in the chamber 61 and holds a target 63 as a sputtering target. The target holding unit 64 is disposed such that the target 63 held by the target holding unit 64 faces the substrate 11 held by the substrate holding unit 62. As an example of the target 63, it is possible to use a target containing an insulator having a specific resistance of $1\times10^7 \Omega \cdot cm$ or more.

The sputtering chamber 26 includes an output supply mechanism 65. As an example of the output supply mechanism 65, it is possible to use a high-frequency power source. The output supply mechanism 65 is electrically connected to a matching device 66, and the matching device 66 is electrically connected to the target holding unit 64. Note that the high-frequency output may be supplied to the target 63 via the target holding unit 64 by the output supply mechanism 65, or the high-frequency output may be supplied directly to the target 63 by the output supply mechanism 65.

The sputtering chamber 26 includes a first gas introduction source 67 that introduces a rare gas into the chamber 61 and a second gas introduction source 68 that introduces an oxygen ($O_2$) gas into the chamber 61. The film forming apparatus 20 includes an evacuation mechanism 69 such as a vacuum pump that evacuates the inside of the chamber 61. Preferably, the rare gas introduced into the chamber 61 by the first gas introduction source 67 is argon (Ar) gas.

In addition, the sputtering chamber 26 preferably includes a flow rate control unit (not illustrated) that controls the ratio between the flow rate of Ar gas introduced by the first gas introduction source 67 and the flow rate of $O_2$ gas introduced by the second gas introduction source 68 during the film formation. The sputtering chamber 26 preferably includes a pressure control unit (not illustrated) that controls the pressure in the chamber 61 during the film formation.

The sputtering chamber 26 includes a magnet 71 that applies a magnetic field to the target 63 and a rotation mechanism 72 that rotates the magnet 71.

Although not illustrated, the sputtering chamber 27 can be configured similarly to the sputtering chamber 26.

As mentioned above, the control unit 28 is provided with a CPU, and further comprises the process controller (computer) 31 which controls respective units of the film forming apparatus 20, the user interface unit 32, and the storage unit 33.

The user interface unit 32 includes a keyboard by which an operator performs a command input operation to manage the film forming apparatus 20, a display that visualizes and displays an operation status of the film forming apparatus 20, and the like.

The storage unit 33 stores a recipe having a control program (software), processing condition data, or the like stored therein for realizing various processes executed by the film forming apparatus 20 through the control of the process controller 31. Then, as necessary, through an instruction from the user interface unit 32 or the like, an arbitrary recipe is called from the storage unit 33 and executed by the process controller 31, thereby performing a desired processing in the film forming apparatus 20 under the control of the process controller 31.

In addition, the recipe such as the control program or the processing condition data may be recorded in a computer-readable recording medium such as a hard disk, a compact disc (CD), a flexible disk, or a semiconductor memory. In such a case, the recording medium having the recipe recorded therein is set in the storage unit 33, and the recipe can be called from the recording medium set in the storage unit 33 and executed by the process controller 31. Alternatively, it is also possible to cause the recipe to be transmitted as needed from another device via, for example, a dedicated line, thereby calling the recipe online and executing the recipe by the process controller 31.

<Method for Producing Film Structure>

Figure 11:
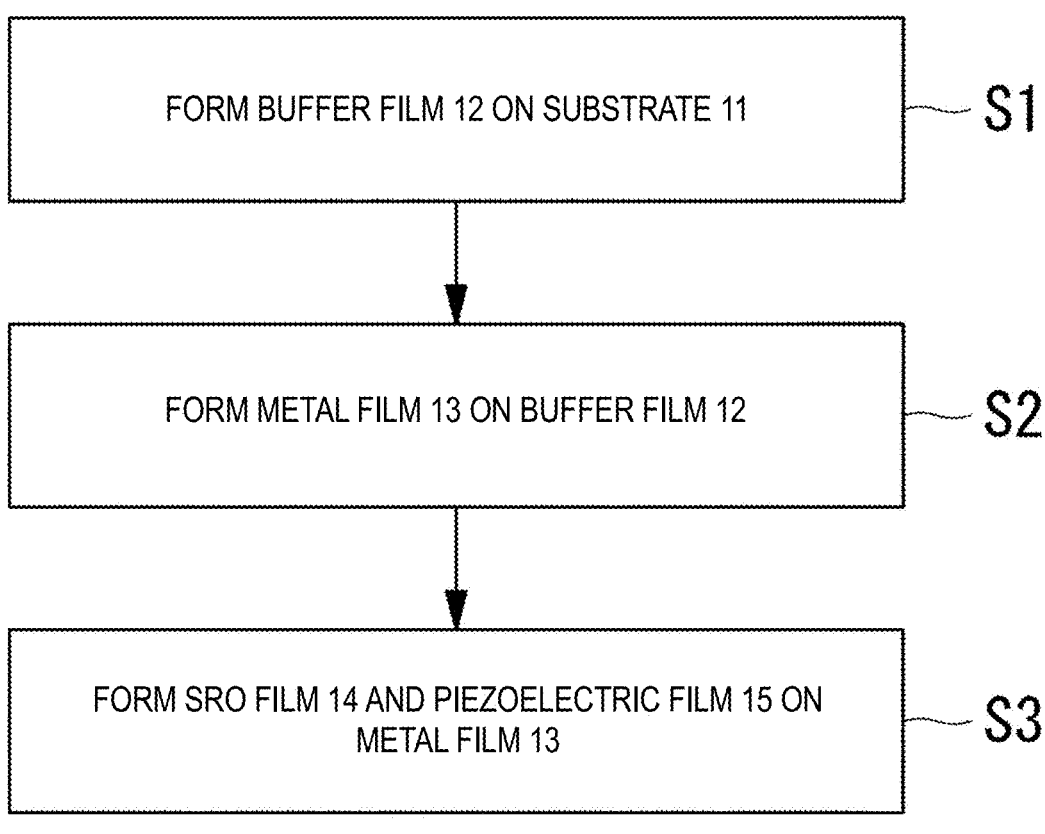
FIG. 11 is a flowchart showing some steps of a method for producing the film structure according to the embodiment.
Figure 12:
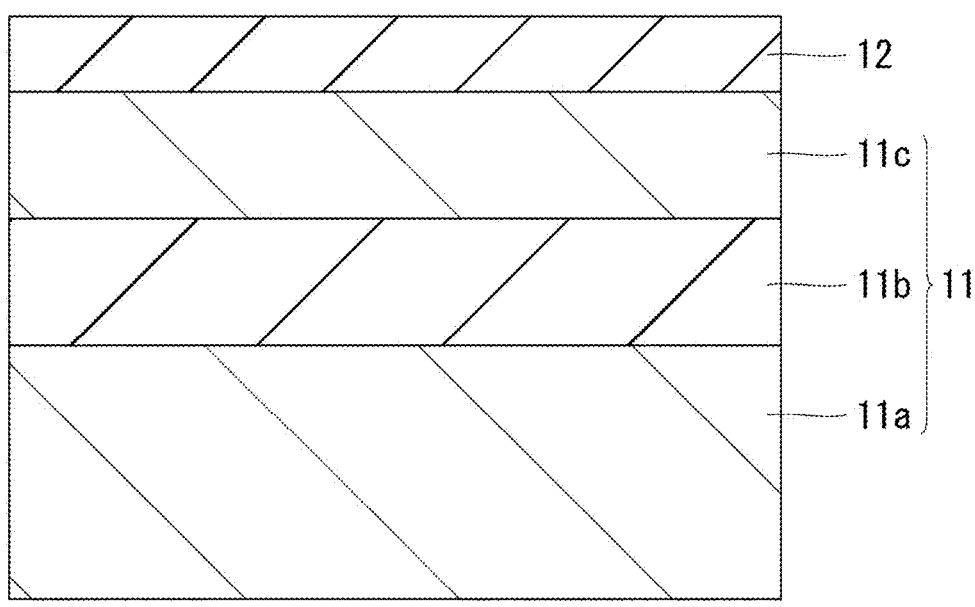
FIG. 12 is a cross-sectional view of a film structure during a production process according to the embodiment.
Figure 13:
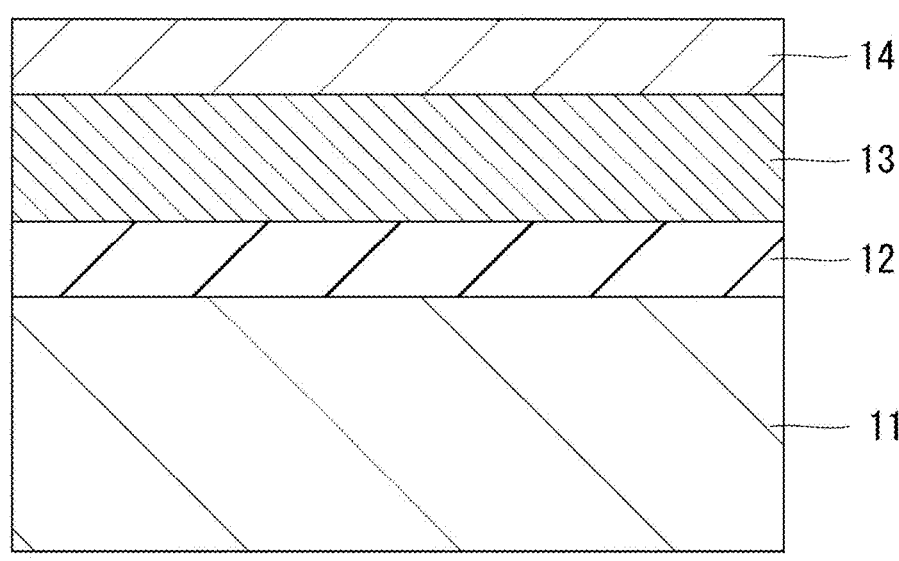
FIG. 13 is a cross-sectional view of a film structure during a production process according to the embodiment.

Next, a method for producing the film structure of the embodiment will be described with reference to FIGS. 1, 4, 6, and 11 to 13. FIG. 11 is a flowchart showing some steps of a method for producing the film structure according to the embodiment. FIGS. 12 and 13 are cross-sectional views of a film structure during a production process according to the embodiment.

First, as illustrated in FIG. 6, a substrate 11 that is a 36° to 48° rotated Y-cut Si substrate is prepared, that is, produced. At this time, an oxide film such as a $SiO_2$ film may be formed on the upper surface of the substrate 11.

When the substrate 11 is a 42° rotated Y-cut Si substrate, that is, when the rotation angle of the rotated Y-cut Si substrate is 42°, as described later with reference to FIGS. 14 to 18, the buffer film 12 includes $ZrO_2$ epitaxially grown on the substrate 11, and the metal film 13 includes a Pt film epitaxially grown on the buffer film 12. Accordingly, it becomes easier to make the metal films 13 formed on the buffer film 12 align in a fixed direction, and make the piezoelectric films 15 (see FIG. 4) formed on the metal film 13 align in a fixed direction, and it is possible to achieve a film structure having the polarization directions of the piezoelectric films 15 aligned in a fixed direction.

Besides, when the rotation angle of the rotated Y-cut Si substrate is 36° or more, the rotation angle is not too far from 42° as compared to a case where the rotation angle is less than 36°. Thus, similarly to the case of a 42° rotated Y-cut Si substrate, the buffer film 12 may include $ZrO_2$ epitaxially grown on the substrate 11, and the metal film 13 may include a Pt film epitaxially grown on the buffer film 12.

Besides, when the rotation angle of the rotated Y-cut Si substrate is 48° or less, the rotation angle is not too far from 42° as compared to a case where the rotation angle exceeds 48°. Thus, similarly to the case of a 42° rotated Y-cut Si substrate, the buffer film 12 may include $ZrO_2$ epitaxially grown on the substrate 11, and the metal film 13 may include a Pt film epitaxially grown on the buffer film 12.

Furthermore, as illustrated in FIG. 12, a substrate 11 that is a SOI substrate can be prepared, that is, produced instead of the substrate 11 that is a Si substrate. When a SOI substrate is used as the substrate 11, the substrate 11 includes the base substance 11a made of a 36° to 48° rotated Y-cut Si substrate, the BOX layer 11b formed on the base substance 11a, and the Si layer 11c which is a SOI layer formed on the BOX layer. The Miller index (alignment direction) of a crystal plane on the upper surface of the Si layer 11c, that is, the main surface of the substrate 11 is identical to the Miller index (alignment direction) of a crystal plane on the upper surface of the base substance 11a, that is, the main surface of the base substance 11a.

When the base substance 11a is a 42° rotated Y-cut Si substrate and the Miller index (alignment direction) of a crystal plane on the upper surface of the Si layer 11c, that is, the main surface of the substrate 11 is identical to the Miller index (alignment direction) of a crystal plane on the upper surface of the base substance 11a, that is, the main surface of the base substance 11a, the buffer film 12 includes $ZrO_2$ epitaxially grown on the Si layer 11c, and the metal film 13 includes a Pt film epitaxially grown on the buffer film 12, similarly to the case where the substrate 11 is a 42° rotated Y-cut Si substrate. Accordingly, it becomes easier to make the metal films 13 formed on the buffer film 12 align in a fixed direction, and make the piezoelectric films 15 (see FIG. 4) formed on the metal film 13 align in a fixed direction, and it is possible to achieve a film structure having the polarization directions of the piezoelectric films 15 aligned to a fixed direction.

Besides, when the rotation angle of the rotated Y-cut Si substrate that is the base substance 11a is 36° or more, the rotation angle is not too far from 42° as compared to a case where the rotation angle is less than 36°. Thus, similarly to the case where the base substance 11a is a 42° rotated Y-cut Si substrate, the buffer film 12 may include $ZrO_2$ epitaxially grown on the Si layer 11c, and the metal film 13 may include a metal film epitaxially grown on the buffer film 12.

Besides, when the rotation angle of the rotated Y-cut Si substrate that is the base substance 11a is 48° or less, the rotation angle is not too far from 42° as compared to a case where the rotation angle exceeds 48°. Thus, similarly to the case where the base substance 11a is a 42° rotated Y-cut Si substrate, the buffer film 12 may include $ZrO_2$ epitaxially grown on the Si layer 11c, and the metal film 13 may include a metal film epitaxially grown on the buffer film 12.

Next, as illustrated in FIG. 6, the buffer film 12 is formed on the substrate 11 (step S1 in FIG. 11).

In step S1, first, the substrate 11 is transferred to the vapor deposition chamber 24 (see FIG. 7) by use of the transfer robot 23 (see FIG. 7), and the transferred substrate 11 is held by the substrate holder 43 (see FIG. 8). Furthermore, in a state where the substrate 11 held by the substrate holder 43 (see FIG. 8) has been disposed in a constant vacuum atmosphere, the substrate 11 is heated to, for example, 700° C. by the heater 46 (see FIG. 8) as a substrate heating mechanism.

Next, in step S1, the deposition material of a zirconium (Zr) single crystal is heated by irradiating the vapor deposition material with an electron beam emitted from the electron gun 44 (see FIG. 8) to evaporate the deposition material. At this time, the evaporated Zr reacts with oxygen on the substrate 11 which has been heated to, for example, 700° C., whereby a zirconium oxide ($ZrO_2$) film is formed. In this way, the buffer film 12 containing $ZrO_2$ epitaxially grown on the substrate 11 is formed.

Next, the metal film 13 epitaxially grown on the buffer film 12 is formed (step S2 in FIG. 11).

In step S2, first, the substrate 11 having the buffer film 12 formed thereon, is transferred to the sputtering chamber 25 (see FIG. 7) by use of the transfer robot 23 (see FIG. 7), and the transferred substrate 11 is held by the substrate holding unit 52 (see FIG. 9). In addition, the substrate 11 is heated to, for example, 450 to 600° C. by a substrate heating mechanism in a state where the substrate 11 has been disposed in a constant vacuum atmosphere.

In step S2, next, a target made of, for example, Pt is DC-sputtered to form a metal film 13 including, for example, a Pt film on the buffer film 12 as illustrated in FIG. 1.

Preferably, in step S2, an epitaxially grown metal film 13 including a Pt film is formed on the buffer film 12.

Since the buffer film 12 contains $ZrO_2$ epitaxially grown on the substrate 11, it becomes possible to make the Pt film included in the metal film 13 align in a fixed direction. Since the metal film 13 includes the Pt film, the Pt films are aligned in the fixed direction, and thus, it becomes more easier to make the piezoelectric films 15 (see FIG. 4) formed on the metal film 13 align in a fixed direction.

After the metal film 13 including the epitaxially grown Pt film is formed in step S2, the SRO film 14 epitaxially grown on the metal film 13 is preferably formed as illustrated in FIG. 13 (step S3 in FIG. 11). As a result, it is possible to epitaxially grow the piezoelectric film containing the composite oxide having the perovskite-type structure on the substrate 11 more easily.

Preferably, the piezoelectric film 15 contains PZT, AlN, LiTaO$_3$ or LiNbO$_3$. Since the piezoelectric film 15 contains PZT, AlN, LiTaO$_3$ or LiNbO$_3$, and since the piezoelectric constants of PZT, AlN, LiTaO$_3$ or LiNbO$_3$ are larger than those of the other materials, the piezoelectric property of the piezoelectric film 15 can be improved.

After the epitaxially grown SRO film 14 is formed on the metal film 13 in step S3, a PZT film 15a, that is a piezoelectric film 15 epitaxially grown on the SRO film 14, is preferably formed as illustrated in FIG. 4. As a result, the piezoelectric property of the piezoelectric film 15 can be improved. As described, with reference to FIG. 5, in the first modification of the embodiment, it is also possible to form the PZT film 15a as the piezoelectric film 15 on the buffer film 12 without the metal film 13 interposed therebetween.

In step S3, when the epitaxially grown SRO film 14 is formed on the metal film 13, two diffraction peaks respectively representing the SRO (110) planes are observed in the in-plane X-ray diffraction pattern of the film structure, as described later with reference to FIG. 15, and thus, it is possible to easily confirm that the SRO film 14 is epitaxially grown.

When the epitaxially grown SRO film 14 is formed on the metal film 13 in step S3, the PZT film 15a, that is the piezoelectric film 15 epitaxially grown on the SRO film 14, is preferably formed. In such a case, two diffraction peaks respectively representing the PZT (213) planes of the PZT film 15a are observed in the in-plane X-ray diffraction pattern of the film structure, as described later with reference to FIG. 17, and thus, it is possible to easily confirm that the PZT film 15a is epitaxially grown.

Preferably, as described later with reference to FIG. 18, three reciprocal lattice points respectively representing the PZT (110) plane of the PZT film 15a, the Si (220) plane of the substrate 11, and the PZT (112) plane of the PZT film 15a are aligned in a Qz direction in the X-ray reciprocal lattice space mapping of the film structure.

In such a case, it is possible to confirm that the PZT film 15a has been epitaxially grown, and it is possible to easily confirm that the PZT film 15a is epitaxially grown on the 36° to 48° rotated Y-cut Si substrate. Furthermore, it is estimated that the PZT (110) plane of the PZT film 15a perpendicular to the Si (100) plane (referred to as Si (001) plane) forming an angle of 42° with respect to the surface of the 42° rotated Y-cut Si substrate and the Si (110) plane perpendicular to Si (001) plane are parallel to each other.

In addition, the process for producing the film structure of the present embodiment can be performed using the film forming apparatus 20. In such a case, the recipe such as the control program or the processing condition data in the process for producing the film structure of the present embodiment is a program for causing the control unit 28 included in the film forming apparatus 20 to execute the process for producing the film structure of the present embodiment. In addition, the recording medium which is set in the storage unit 33 and which has a recipe such as a control program or processing condition data stored therein, is a recording medium which records therein a program for causing the control unit 28 included in the film forming apparatus 20 to execute the process for producing the film structure of the present embodiment. In addition, the control unit 28 controls the operations of the buffer film forming unit (vapor deposition chamber 24), the metal film forming unit (sputtering chamber 25), and the SRO film forming unit (sputtering chamber 26) such that the buffer film forming unit, the metal film forming unit, and the SRO film forming unit execute the process for producing the film structure of the present embodiment.

EXAMPLES

Hereinafter, the present embodiment will be described in more detail based on examples. Note that the present invention is not limited by the following examples.

Examples

The film structure 10 described in the embodiment with reference to FIG. 4 was formed as a film structure in an example.
[Formation of Film Structure]
A method for forming the film structure according to the example will be described. First, a 42° rotated Y-cut Si substrate was prepared as a substrate.

Next, a ZrO$_2$ film was formed as a buffer film on a wafer as a substrate by an electron beam evaporation method.

Next, a Pt film was formed as a metal film on the ZrO$_2$ film through a sputtering method.

Next, a SRO film was formed on the Pt film through a sputtering method.

Next, a PZT film was formed on the SRO film through a sputtering method.
[$\omega$-$2\theta$ Spectrum and $\varphi$ Scanning Spectrum of Film Structure]

For the film structure of the example, a $\omega$-$2\theta$ spectrum (out-of-plane X-ray diffraction pattern) and a $\varphi$ scanning spectrum (in-plane X-ray diffraction pattern) are measured through an XRD method. That is, X-ray diffraction measurement (out-of-plane measurement) through $\omega$-$2\theta$ scan and X-ray diffraction measurement (in-plane measurement) through $\varphi$ scan were performed on the film structure of the example in which the films up to the PZT film were formed.

Figure 14:
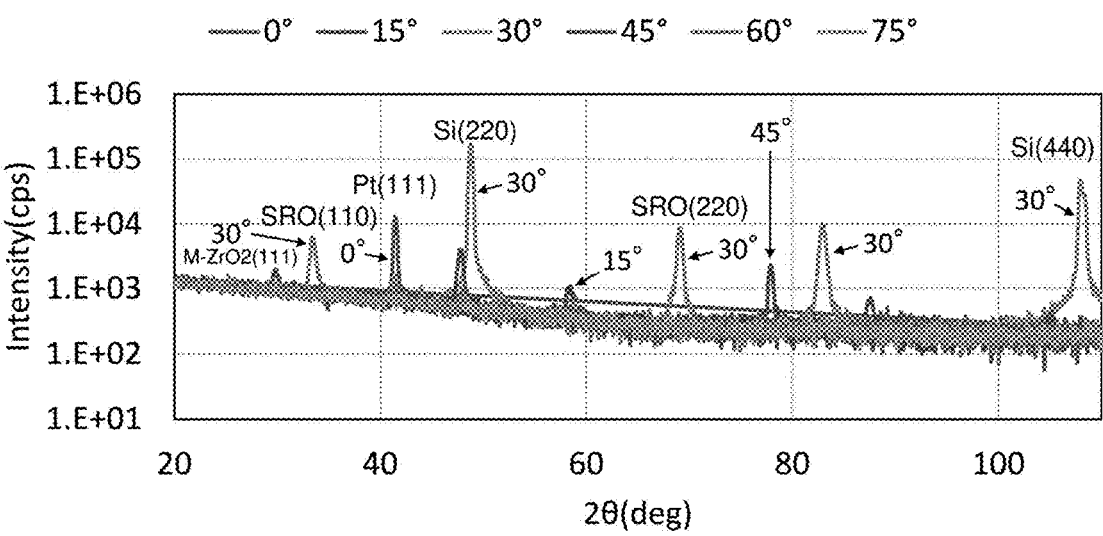
FIG. 14 is a graph showing an example of a $\omega$-$2\theta$ spectrum, through an XRD method, of a film structure according to an example.

FIG. 14 is a graph showing an example of a $\omega$-$2\theta$ spectrum, through an XRD method, of the film structure according to the example. The horizontal axis of the graph in FIG. 14 represents the angle $2\theta$, and the vertical axis of the graph in FIG. 14 represents the intensity of the X-ray (the same applies to FIG. 16 described later). FIG. 14 shows a range of $20° \leq 2\theta \leq 110°$ (the same applies to FIG. 16 described later). In FIG. 14, M-ZrO$_2$ means ZrO$_2$ having a monoclinic crystal structure.

In FIG. 14, the case where the angle between the surface (measurement surface) for which the surface spacing (lattice constant) is obtained and the substrate surface (for example, @-0) is equal to 0° is represented at 0° (the same applies to FIG. 16 described later). In addition, the case where the angle between the measurement surface and the substrate surface is different from 0° is represented at angles between the measurement surface and the substrate surface of 15°, 30°, 45°, 60°, and 75° (the same applies to FIG. 16 described later). The case where the angle between the measurement surface and the substrate surface is less than 90°, corresponds to the out-of-plane measurement, and the case where the angle between the measurement surface and the substrate surface is equal to 90°, corresponds to the in-plane measurement.

The example illustrated in FIG. 14, shows the results of measuring six ω-2θ spectrums by performing the axis setting at the diffraction peak on the Si (220) plane of the Si substrate in a state the angle between the measurement surface and the substrate surface is approximately 30°, and subsequently changing the angle between the measurement surface and the substrate surface to 0°, 15°, 30°, 45°, 60°, and 75°.

In the six ω-2θ spectrums illustrated in FIG. 14, diffraction peaks of a ZrO$_2$ (111) plane, a SRO (110) plane, a Pt (111) plane, and a SRO (220) plane were observed in addition to diffraction peaks of a Si (220) plane and a Si (440) plane. Specifically, diffraction peaks of the ZrO$_2$ (111) plane and the Pt (111) plane were observed when the angle between the measurement surface and the substrate surface was 0°, and diffraction peaks of the SRO (110) plane, the Si (220) plane, the SRO (220) plane, and the Si (440) plane were observed when the angle between the measurement surface and the substrate surface was 30°. As described above, the observed diffraction peaks were completely different from one another in the six ω-2θ spectrums.

Therefore, in the film structure of the example, it has been confirmed that the ZrO$_2$ film, the Pt film, and the SRO film were formed on the Si substrate. In addition, it has been confirmed that each of the ZrO$_2$ film, the Pt film, and the SRO film included in the film structure of the example was aligned in all of three directions orthogonal to each other, that is, three-dimensionally aligned, and epitaxially grown.

Figure 15:
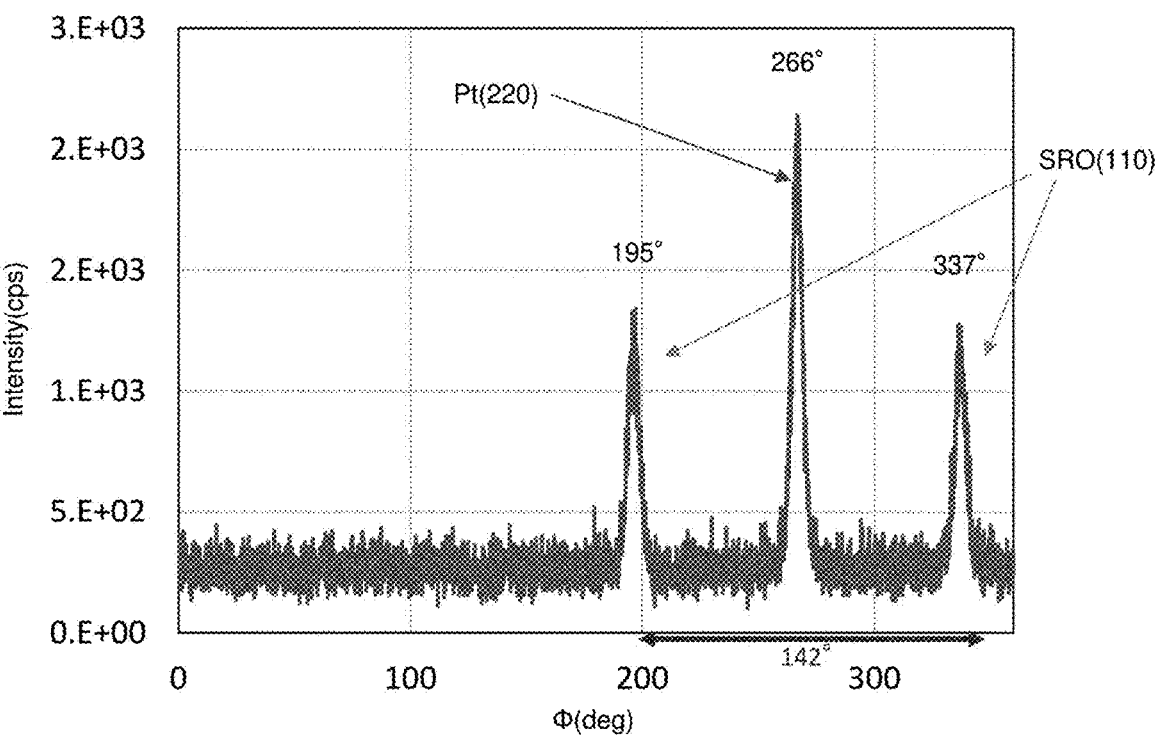
FIG. 15 is a graph showing an example of a $\varphi$ scanning spectrum, through an XRD method, of a film structure according to the example.

FIG. 15 is a graph showing an example of a φ scanning spectrum, through an XRD method, of a film structure according to the example. The horizontal axis of the graph in FIG. 15 represents the angle φ, and the vertical axis of the graph in FIG. 15 represents the intensity of the X-ray (the same applies to FIG. 17 described later). FIG. 15 shows a range of 0°≤φ≤360° (the same applies to FIG. 17 described later).

In the example illustrated in FIG. 15, φ scanning is performed in a state where an adjustment has been made such that the angle between the measurement surface and the substrate surface is approximately 90° (in-plane measurement), and 2θ becomes equal to the angle corresponding to the diffraction peak of the SRO (110) plane.

In the φ scan illustrated in FIG. 15, one diffraction peak representing the Pt (220) plane was observed at an angular position of φ=266°, and two diffraction peaks respectively representing the SRO (110) planes were observed at two angular positions of φ=195° and φ=337° (angular difference Δφ=) 142°. Therefore, it is obvious that the Pt film was epitaxially grown on the Si substrate and the SRO film was epitaxially grown on the Pt film. Furthermore, it is estimated that the SRO film has 2-fold symmetry.

Figure 16:
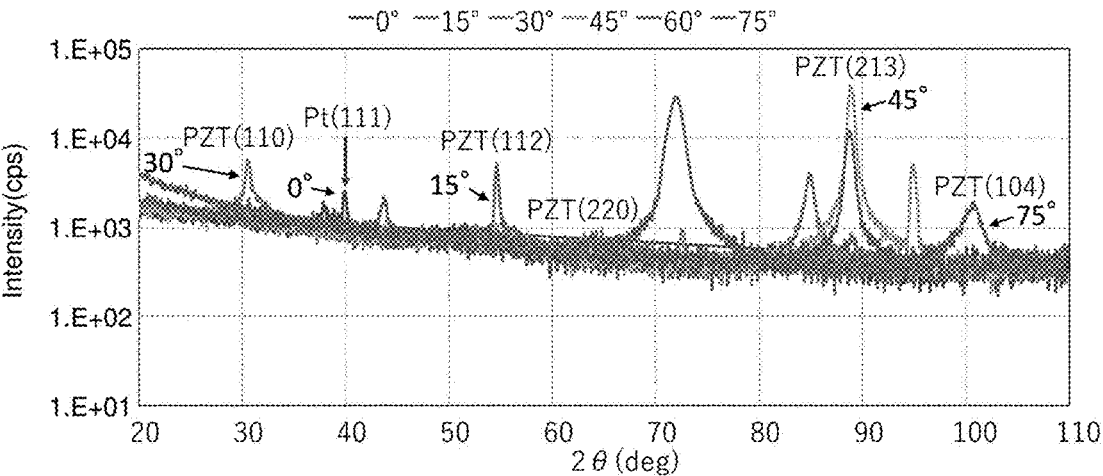
FIG. 16 is a graph showing an example of a $\omega$-$2\theta$ spectrum, through an XRD method, of the film structure according to the example.

FIG. 16 is a graph showing an example of a ω-2θ spectrum, through an XRD method, of the film structure according to the example. The example illustrated in FIG. 16, shows the results of measuring six ω-2θ spectrums by performing the axis setting at the diffraction peak on the PZT (213) plane of the PZT film in a state the angle between the measurement surface and the substrate surface is approximately 45°, and subsequently changing the angle between the measurement surface and the substrate surface to 0°, 15°, 30°, 45°, 60°, and 75°.

In the six ω-2θ spectrums illustrated in FIG. 16, diffraction peaks of a PZT (110) plane, a Pt (111) plane, a PZT (112) plane, a PZT (213) plane, and a PZT (104) plane, were observed. Specifically, a diffraction peak of the Pt (111) plane was observed when the angle between the measurement surface and the substrate surface was 0°, and a diffraction peak of the PZT (112) plane was observed when the angle between the measurement surface and the substrate surface was 15°. Besides, a diffraction peak of the PZT (110) plane was observed when the angle between the measurement surface and the substrate surface was 30°, a diffraction peak of the PZT (213) plane was observed when the angle between the measurement surface and the substrate surface was 45°, and a diffraction peak of the PZT (104) plane was observed when the angle between the measurement surface and the substrate surface was 75°. As described above, the observed diffraction peaks were completely different from one another in the six ω-2θ spectrums.

Therefore, in the film structure of the example, it has been confirmed that the Pt film and the PZT film were formed. In addition, it has been confirmed that the Pt film and the PZT film included in the film structure of the example were aligned in all of three directions orthogonal to each other, that is, three-dimensionally aligned, and epitaxially grown.

Figure 17:
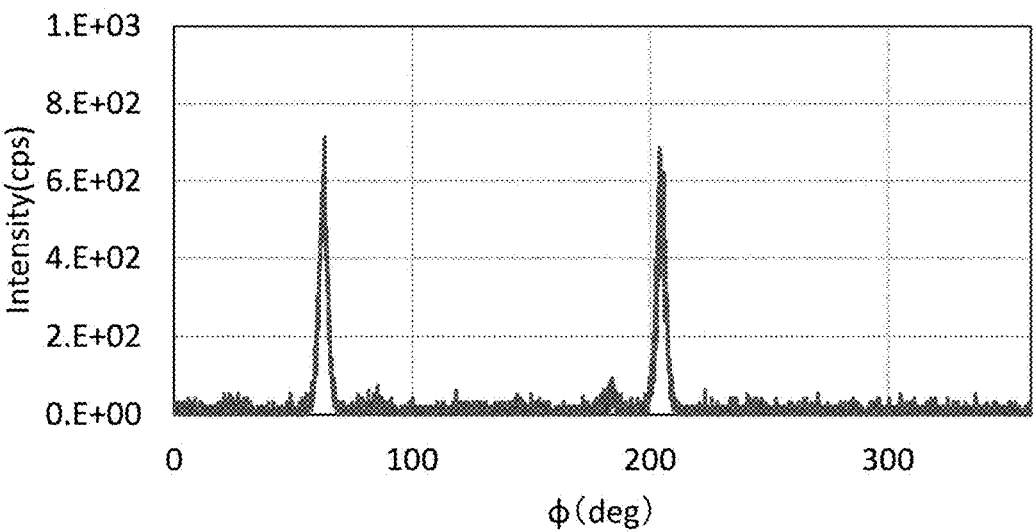
FIG. 17 is a graph showing an example of a $\varphi$ scanning spectrum, through an XRD method, of the film structure according to the example.

FIG. 17 is a graph showing an example of a φ scanning spectrum, through an XRD method, of the film structure according to the example. In the example illustrated in FIG. 17, q scanning is performed in a state where an adjustment has been made such that the angle between the measurement surface and the substrate surface is approximately 90° (in-plane measurement), and 2θ becomes equal to the angle corresponding to the diffraction peak of the PZT (213) plane.

During the φ scanning illustrated in FIG. 17, two diffraction peaks representing the PZT (213) planes were observed. Therefore, it is obvious that the PZT film was epitaxially grown. Furthermore, it is estimated that the PZT film has 2-fold symmetry.

[X-Ray Reciprocal Lattice Space Mapping of Film Structure]

Next, X-ray reciprocal lattice space mapping was performed on the film structure of the example. The X-ray reciprocal lattice space mapping aims to three-dimensionally observe a film to be measured and confirm the fluctuation of a lattice constant and the inclination of a lattice plane.

Figure 18:
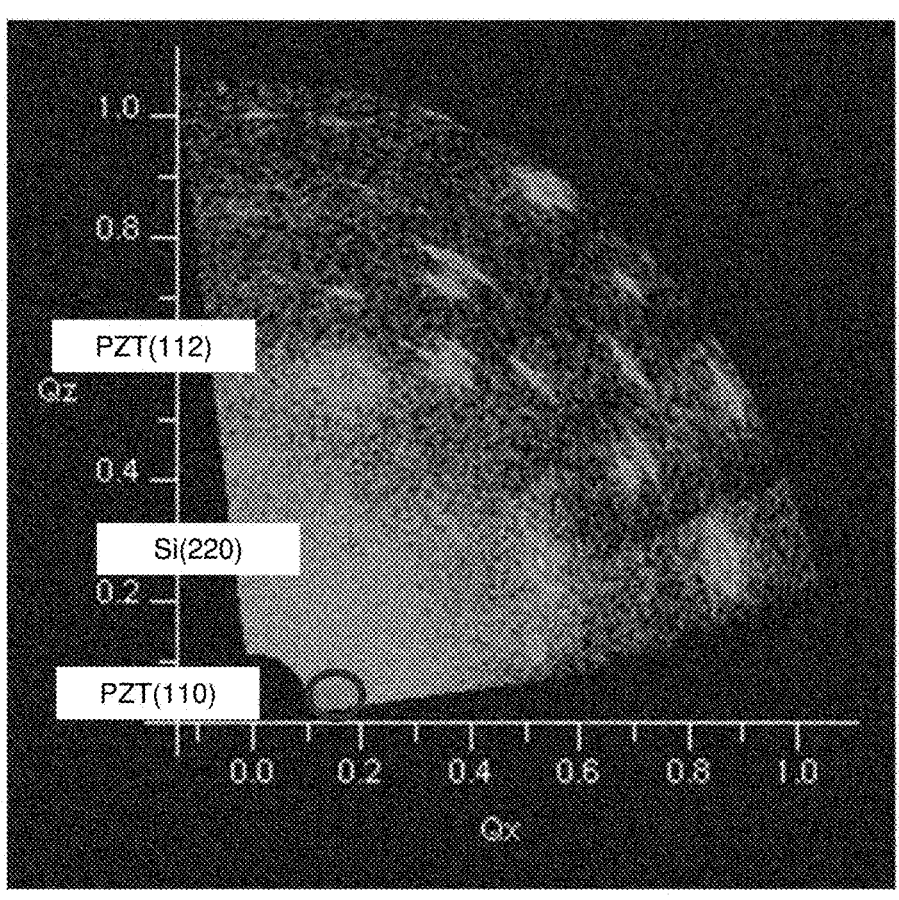
FIG. 18 is a graph showing a result of X-ray reciprocal lattice space mapping of the film structure according to the example.

FIG. 18 is a graph showing a result of X-ray reciprocal lattice space mapping of the film structure according to the example. The horizontal axis in FIG. 18 represents a Qx direction that is a direction of a reciprocal lattice space corresponding to a lattice constant in a direction parallel to a Si (100) plane (referred to as a Si (001) plane) of the Si substrate forming an angle of 42° with respect to the surface of the 42° rotated Y-cut Si substrate in the real space, and the vertical axis in FIG. 18 represents a Qz direction that is a direction of a reciprocal lattice space corresponding to a direction perpendicular to the Si (001) plane in the real space.

As illustrated in FIG. 18, in the X-ray reciprocal lattice space mapping of the film structure of the example, the reciprocal lattice points are not annularly distributed around the origin but are distributed as points. On the basis of the description above, it has been confirmed that the respective films included in the film structure of the example were aligned in all of three directions orthogonal to each other, that is, three-dimensionally aligned, and epitaxially grown.

Besides, as illustrated in FIG. 18, three reciprocal lattice points respectively representing the PZT (110) plane of the PZT film, the Si (220) plane of the substrate, and the PZT (112) plane of the PZT film are aligned in the Qz direction in the X-ray reciprocal lattice space mapping of the film structure of the example. On the basis of the description above, it has been confirmed that the PZT film included in the film structure of the example was epitaxially grown. Furthermore, it is estimated that the PZT (110) plane of the PZT film perpendicular to the Si (100) plane (referred to as Si (001) plane) of the Si substrate forming an angle of 42° with respect to the surface of the 42° rotated Y-cut Si substrate and the Si (110) plane perpendicular to the Si (001) plane are parallel to each other.

In the example, a 42° rotated Y-cut Si substrate was used. However, although a detailed description is omitted here, when a 36° rotated Y-cut Si substrate and the 48° rotated Y-cut Si substrate were used instead of the 42° rotated Y-cut Si substrate, and when the SOI substrate described with reference to FIG. 3 was used as the substrate 11, the obtained result was substantially the same as the result obtained when the 42° rotated Y-cut Si substrate was used. Therefore, it has been confirmed that, even when a Si substrate having a rotated Y-cut Si substrate with any cut angle of 36° to 48° is used and in a case where the SOI substrate described with reference to FIG. 3 is used as the substrate 11, the substantially the same result can be obtained.

Although the invention made by the present inventors has been specifically described based on the embodiments, the present invention is not limited to the above embodiments, and needless to say, various modifications can be made without departing from the gist of the present invention.

Within the scope of the idea of the present invention, a person skilled in the art could conceive of various changes and modifications, and it is understood that the changes and modifications also fall within the scope of the present invention.

For example, inventions obtained through the addition or deletion of components, or the design change, or the addition or deletion of processes, or the condition change, performed appropriately by a person skilled in the art, on the respective embodiments mentioned above, are included in the scope of the present invention as long as the gist of the present invention is included therein.

What is claimed is:

1. A film structure comprising:
a substrate; and
a buffer film formed on the substrate;
wherein;
the substrate is a 36° to 48° rotated Y-cut Si substrate, or
the substrate is a SOI substrate comprising a base substance made of a 36° to 48° rotated Y-cut Si substrate, an insulating layer on the base substance, and a SOI layer made of a Si film on the insulating layer,
a Miller index of a crystal plane of an upper surface of the SOI layer is equal to the Miller index of a crystal plane of an upper surface of the base substance, and
the buffer film comprises $ZrO_2$ epitaxially grown on the substrate.

2. The film structure according to claim 1, further comprising a metal film epitaxially grown on the buffer film.

3. The film structure according to claim 2, wherein the metal film comprises Pt.

4. The film structure according to claim 2, further comprising a SRO film epitaxially grown on the metal film.

5. The film structure according to claim 4, further comprising a piezoelectric film epitaxially grown on the SRO film.

6. The film structure according to claim 5, wherein
the piezoelectric film is a PZT film comprising PZT, and
two diffraction peaks respectively representing PZT (213) planes of the PZT film are observed in an in-plane X-ray diffraction pattern of the film structure.

7. The film structure according to claim 6, wherein, in an X-ray reciprocal lattice space mapping of the film structure, three reciprocal lattice points respectively representing a PZT (110) plane of the PZT film, a Si (220) plane of the substrate, and a PZT (112) plane of the PZT film are aligned in a Qz direction.

8. The film structure according to claim 4, wherein two diffraction peaks respectively representing SRO (110) planes of the SRO film are observed in an in-plane X-ray diffraction pattern of the film structure.

9. The film structure according to claim 2, further comprising a piezoelectric film epitaxially grown on the metal film.

10. The film structure according to claim 9, wherein the piezoelectric film comprises PZT, AlN, $LiTaO_3$, or $LiNbO_3$.

11. The film structure according to claim 1, further comprising a piezoelectric film epitaxially grown on the buffer film.

12. A method for producing a film structure comprising:
(a) a step for preparing a substrate; and
(b) a step for forming a buffer film on the substrate;
wherein
the step (a) comprises preparing (1) a 36° to 48° rotated Y-cut substrate is prepared, or (2) a SOI substrate comprising a base substance made of a 36° to 48° rotated Y-cut Si substrate, an insulating layer on the base substance, and a SOI layer made of a Si film on the insulating layer,
a Miller index of a crystal plane of an upper surface of the SOI layer is equal to the Miller index of a crystal plane of an upper surface of the base substance, and
the step (b) comprises forming the buffer film comprising $ZrO_2$ epitaxially grown on the substrate.

13. The method for producing the film structure according to claim 12, wherein the method further comprises:
(c) a step for forming a metal film epitaxially grown on the buffer film,
wherein the metal film comprises Pt.

14. The method for producing the film structure according to claim 13, wherein the method further comprises:
(d) a step for forming a SRO film epitaxially grown on the metal film,
wherein two diffraction peaks respectively representing SRO (110) planes of the SRO film are observed in an in-plane X-ray diffraction pattern of the film structure.

15. The method for producing the film structure according to claim 13, wherein the method further comprises;
(e) a step for forming a piezoelectric film epitaxially grown on the metal film,
wherein the piezoelectric film comprises PZT, AlN, $LiTaO_3$, or $LiNbO_3$.

* * * * *